United States Patent
Peng et al.

(10) Patent No.: US 9,785,294 B2
(45) Date of Patent: *Oct. 10, 2017

(54) ACCURACY IN A CAPACITIVE SENSE ARRAY

(71) Applicant: Parade Technologies, Ltd., Santa Clara, CA (US)

(72) Inventors: Tao Peng, Strakville, MS (US); Gregory Landry, Merrimack, NH (US)

(73) Assignee: PARADE TECHNOLOGIES, LTD., Santa Clara, CA (US)

( * ) Notice: Subject to any disclaimer, the term of this patent is extended or adjusted under 35 U.S.C. 154(b) by 303 days.

This patent is subject to a terminal disclaimer.

(21) Appl. No.: 14/557,202

(22) Filed: Dec. 1, 2014

(65) Prior Publication Data

US 2015/0193049 A1    Jul. 9, 2015

Related U.S. Application Data

(63) Continuation of application No. 13/241,514, filed on Sep. 23, 2011, now Pat. No. 8,903,679.

(51) Int. Cl.
*G06F 3/044* (2006.01)
*H03K 17/96* (2006.01)
*G06F 3/041* (2006.01)

(52) U.S. Cl.
CPC ............ *G06F 3/044* (2013.01); *G06F 3/0416* (2013.01); *H03K 17/962* (2013.01); *G06F 2203/04104* (2013.01); *G06F 2203/04112* (2013.01); *H03K 2017/9602* (2013.01)

(58) Field of Classification Search
CPC ................... G06F 3/044; G06F 3/0416; G06F 2203/04104; G06F 2203/04112; H03K 17/962; H03K 2017/9602; A63F 3/00643
See application file for complete search history.

(56) References Cited

U.S. PATENT DOCUMENTS

| | | | |
|---|---|---|---|
| 6,370,965 B1 | 4/2002 | Knapp | |
| 7,129,935 B2 | 10/2006 | Mackey | |
| 7,663,607 B2 | 2/2010 | Hotelling et al. | |
| 7,755,026 B2 | 7/2010 | Pittel et al. | |
| 7,755,612 B2 | 7/2010 | Park et al. | |
| 7,808,255 B2 | 10/2010 | Hristov et al. | |

(Continued)

FOREIGN PATENT DOCUMENTS

| | | |
|---|---|---|
| EP | 2214084 A | 8/2010 |
| EP | 2592533 A | 5/2013 |

(Continued)

OTHER PUBLICATIONS

U.S. Appl. No. 14/098,057, Interleaving Sense Elements of a Capacitive-Sense Array, Dec. 5, 2013, 55 pgs.

(Continued)

*Primary Examiner* — Toan Le
(74) *Attorney, Agent, or Firm* — Morgan, Lewis & Bockius LLP

(57) ABSTRACT

A sense array having at least 3 sets of sense elements disposed substantially parallel with each other, with one of the sense elements of the first set extends between two of the sense elements of the second set and another one of the sense elements of the first set extends between two of the sense elements of the third set.

20 Claims, 9 Drawing Sheets

(56) References Cited

U.S. PATENT DOCUMENTS

| | | |
|---|---|---|
| 7,864,160 B2 | 1/2011 | Geahan et al. |
| 7,973,771 B2 | 7/2011 | Geaghan |
| 8,004,497 B2 | 8/2011 | Xiaoping |
| 8,174,507 B2 | 5/2012 | Xiaoping |
| 8,217,916 B2 | 7/2012 | Anno |
| 8,237,453 B2 | 8/2012 | Badaye et al. |
| 8,432,170 B1 | 4/2013 | Walsh et al. |
| 8,502,796 B1 | 8/2013 | Yilmaz |
| 8,519,973 B1 | 8/2013 | Xiaoping |
| 8,531,418 B2 | 9/2013 | Nolting et al. |
| 8,536,880 B2 | 9/2013 | Philipp |
| 8,614,690 B2 | 12/2013 | Grunthaner et al. |
| 8,648,819 B2 | 2/2014 | Philipp |
| 8,872,526 B1 | 10/2014 | Hoshtanar et al. |
| 8,903,679 B2 * | 12/2014 | Peng ............... H03K 17/962 178/18.06 |
| 2005/0200799 A1 | 9/2005 | Murai |
| 2007/0008299 A1 | 1/2007 | Hristov |
| 2007/0074914 A1 | 4/2007 | Geaghan et al. |
| 2007/0257894 A1 | 11/2007 | Philipp |
| 2007/0268265 A1 | 11/2007 | Xiaoping |
| 2007/0268266 A1 | 11/2007 | XiaoPing |
| 2007/0291009 A1 | 12/2007 | Wright et al. |
| 2008/0309633 A1 | 12/2008 | Hotelling et al. |
| 2009/0002396 A1 | 1/2009 | Andrews et al. |
| 2009/0135157 A1 | 5/2009 | Harley |
| 2009/0159344 A1 | 6/2009 | Hotelling et al. |
| 2009/0189866 A1 | 7/2009 | Haffenden et al. |
| 2009/0252386 A1 | 10/2009 | Dean et al. |
| 2009/0267916 A1 | 10/2009 | Hotelling |
| 2009/0303196 A1 | 12/2009 | Furukawa |
| 2009/0315258 A1 * | 12/2009 | Wallace ............... A63F 3/00643 273/238 |
| 2010/0045614 A1 | 2/2010 | Gray et al. |
| 2010/0045615 A1 | 2/2010 | Gray et al. |
| 2010/0046561 A1 | 2/2010 | Grant et al. |
| 2010/0073301 A1 | 3/2010 | Yousefpor et al. |
| 2010/0079402 A1 | 4/2010 | Grunthaner et al. |
| 2010/0096193 A1 | 4/2010 | Yilmaz et al. |
| 2010/0163394 A1 | 7/2010 | Tang et al. |
| 2010/0214233 A1 | 8/2010 | Lee |
| 2010/0220075 A1 | 9/2010 | Kuo et al. |
| 2010/0271330 A1 | 10/2010 | Philipp |
| 2010/0289503 A1 | 11/2010 | Reynolds et al. |
| 2010/0295821 A1 | 11/2010 | Chang et al. |
| 2010/0302201 A1 | 12/2010 | Ritter et al. |
| 2010/0328255 A1 | 12/2010 | Ishizaki et al. |
| 2011/0006832 A1 | 1/2011 | Land et al. |
| 2011/0025629 A1 | 2/2011 | Grivna et al. |
| 2011/0063251 A1 | 3/2011 | Geaghan et al. |
| 2011/0095990 A1 | 4/2011 | Philipp et al. |
| 2011/0115729 A1 | 5/2011 | Kremin et al. |
| 2011/0141062 A1 | 6/2011 | Yu et al. |
| 2011/0157050 A1 | 6/2011 | Jang et al. |
| 2011/0171998 A1 | 7/2011 | Westerman |
| 2011/0279410 A1 | 11/2011 | Han et al. |
| 2012/0044201 A1 | 2/2012 | Xiaoping |
| 2012/0062472 A1 | 3/2012 | Yilmaz |
| 2012/0062510 A1 | 3/2012 | Mo et al. |
| 2012/0127099 A1 | 5/2012 | Liu et al. |
| 2012/0154324 A1 | 6/2012 | Wright et al. |
| 2012/0169651 A1 | 7/2012 | Chang |
| 2012/0169653 A1 | 7/2012 | Chang |
| 2012/0169655 A1 | 7/2012 | Chang |
| 2012/0169656 A1 | 7/2012 | Chang |
| 2012/0268416 A1 | 10/2012 | Pirogov et al. |
| 2012/0319974 A1 | 12/2012 | Kim et al. |
| 2013/0033451 A1 | 2/2013 | Olson |
| 2013/0049771 A1 | 2/2013 | Peng et al. |
| 2013/0242485 A1 | 9/2013 | Ohtani et al. |
| 2013/0285975 A1 | 10/2013 | Hong et al. |
| 2014/0125361 A1 | 5/2014 | Tevs |
| 2014/0152919 A1 | 6/2014 | Philipp |
| 2014/0160374 A1 | 6/2014 | Wang et al. |

FOREIGN PATENT DOCUMENTS

| | | |
|---|---|---|
| KR | 10-0979910 B1 | 8/2009 |
| KR | 10-2010-0032283 A | 10/2012 |
| KR | 10-2010-0116281 A | 3/2014 |
| WO | WO 2008079596 A1 | 7/2008 |
| WO | WO 2010062808 A2 | 6/2010 |
| WO | WO 2011015827 A2 | 2/2011 |

OTHER PUBLICATIONS

U.S. Appl. No. 14/297,115, Sensor Pattern with Signal-Spreading Electrodes, Jun. 5, 2014, 58 pgs.
USPTO, Office Action for U.S. Appl. No. 14/297,115 dated Sep. 9, 2014, 16 pgs.
Cypress Semiconductor Corporation, International Search Report and Written Opinion, PCT/US2011/053649, Oct. 30, 2012, 8 pgs.
Cypress Semiconductor Corporation, International Preliminary Report on Patentability, PCT/US2011/053649, Mar. 25, 2014, 6 pgs.
Lee et al., "A Multi-touch Three Dimensional Touch-Sensitive Tablet," Computer Systems Research Institute, University of Toronto, Apr. 1985, 5 pgs.
Peng, Office Action, U.S. Appl. No. 13/241,514, Nov. 12, 2013, 11 pgs.
Peng, Notice of Allowance, U.S. Appl. No. 13/241,514, Feb. 24, 2014, 7 pgs.
Peng, Notice of Allowance, U.S. Appl. No. 13/241,514, Apr. 1, 2014, 8 pgs.
Peng, Notice of Allowance, U.S. Appl. No. 13/241,514, May 13, 2014, 7 pgs.
Peng, Notice of Allowance, U.S. Appl. No. 13/241,514, Jun. 27, 2014, 7 pgs.
Peng, Notice of Allowance, U.S. Appl. No. 13/241,514, Aug. 13, 2014, 7 pgs.
Peng, Notice of Allowance, U.S. Appl. No. 13/241,514, 118SEP2014, 7 pgs.
Peng, Notice of Allowance, U.S. Appl. No. 13/241,514, 118SEP20 4, 7 pgs.
USPTO, Office Action, U.S. Appl. No. 13/242,703, Sep. 26, 2013, 18 pgs.
USPTO, Final Office Action, U.S. Appl. No. 13/242,703, Apr. 8, 2014, 19 pgs.
USPTO, Office Action, U.S. Appl. No. 13/242,703, Aug. 1, 2014, 21 pgs.
USPTO, Office Action, U.S. Appl. No. 14/098,057, Feb. 20, 2014, 19 pgs.
USPTO Final Office Action for U.S. Appl. No. 14/098,057 dated Jun. 19, 2014, 14 pgs.
USPTO Notice of Allowance for U.S. Appl. No. 14/098,057 dated Jul. 7, 2014, 8 pgs.
USPTO Notice of Allowance for U.S. Appl. No. 14/098,057 dated Sep. 16, 2014, 8 pgs.
St Microelectronics, "Guidelines for Designing Touch Sensing Applicatins with Surface Sensors," retrieved from http://www.st.com/st-web/ui/static.

* cited by examiner

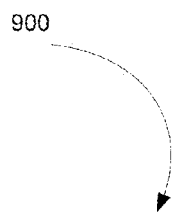
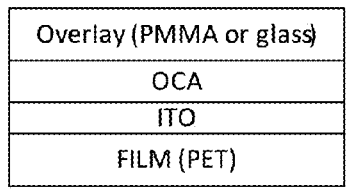
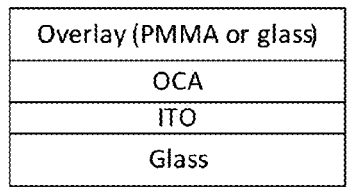
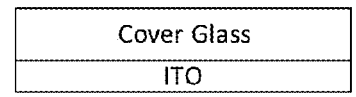
(a) PET technology
(b) Glass technology
(c) Sensor on cover technology
FIG. 9A     FIG. 9B     FIG. 9C

ACCURACY IN A CAPACITIVE SENSE ARRAY

CROSS-REFERENCE TO RELATED APPLICATIONS

This application is a continuation of U.S. patent application Ser. No. 13/241,514, filed Sep. 23, 2011, now U.S. Pat. No. 8,903,679, which is incorporated by reference herein in its entirety.

TECHNICAL FIELD

This disclosure relates to the field of user interface devices and, in particular, to capacitive sense devices.

BACKGROUND

Capacitive sense arrays may be used to replace mechanical buttons, knobs and other similar mechanical user interface controls. Touch sensing devices that utilize capacitive sense arrays are ubiquitous in today's industrial and consumer markets. They can be found on cellular phones, GPS devices, cameras, computer screens, MP3 players, digital tablets, and the like. Manufacture cost is the major concern of such touch sensing devices. There is a constant tradeoff between the function of the touch sensing devices and their costs. One of the major cost factors is number of Indium Tin Oxide (ITO) layers needed to assemble the capacitive sense elements to in the touch sensing devices. Both the cost and the function are proportional to the number of ITO layers. It would be ideal to support as many functions as possible on a single layer ITO stack-up. However, one major challenge of a single layer ITO application is accuracy. Accuracy in touch panel application is defined as error between the location of physical touch and the location sensed by the touch system. The sensed, or calculated location is based on the overall signal magnitude and profile. A single finger touch will generate signal across a neighborhood of sensor nodes which is called as signal profile. Signal degradation or deformed signal profile tends to cause accuracy problems in touch recognition.

FIG. 1 illustrates a conventional pattern design of a single ITO layer comprising capacitive sense array 100. The capacitive sense array 100 includes multiple rows 101 of sense elements such as each row 101 on the capacitive sense array 100 is covered by a pair of first set of sense elements 102 and a second set of sense elements 104 interleaved into each other's sub-fingers. A conductive object, such as a finger, lands on the capacitive sense array 100, and a signal is generated on both the first set of sense elements 102 and the second set of sense elements 104 along the same row. Since a finger would normally activate about three or more neighboring rows of sense elements, a signal profile can be readily obtained and a centroid can be generated with reasonable accuracy. However, the area between the rows 101 of the first set of sense elements 102 and the second set of sense elements 104 along vertical axis is known as a dead zone area as illustrated in FIG. 1. The dead zone as defined in the present application as an area between the pairs of the sense elements along the vertical axis that receives part of the signal from a sense element of one pair and part of the signal from a sense element of the other pair. However, this signal generated partly from each pair provides a split signal which is inconsistent and not sufficient for centroid determination. So, without a complete signal profile, the centroid determination of the finger would certainly have some error in the centroid algorithm as the data retrieved from the signal profile is unbalanced, resulting in an accuracy error periodically in between every row of the sense elements of the ITO layer of the touch panel device. A graphical representation of the above described periodic error is illustrated in FIG. 4. The periodic error 410 is substantially a sine wave that occurs along the y-axis for the row 101 of FIG. 1. The zero values on y-axis of the periodic error 410 indicate the signals generated at center of the sense element for the row 101. The values above and below the zero on y-axis represent the signals generated by the sense elements of the neighboring rows. These values represent the dead zone area

BRIEF DESCRIPTION OF THE DRAWINGS

The present invention is illustrated by way of example, and not of limitation, in the figures of the accompanying drawings in which:

FIGS. 9A-9C illustrates embodiments of assembled layer structures of the capacitive sense array.

DETAILED DESCRIPTION

A capacitive sense array configured to improve accuracy in detecting a presence of a conductive object is described. In one embodiment, the capacitive sense array includes a first set of sense elements including a plurality of sub-sections and a second set of sense elements including a plurality of sub-sections such that the plurality of sub-sections of one sense element of the first set straddle at least one of the plurality of sub-sections of at least two of the sense elements of the second set. The straddle as defined in the present invention is shifting and interleaving sub-section of one sense element with the sub-sections of at least two sense elements adjacent to the one sense element.

The embodiments described herein are configured to improve accuracy of the capacitive sense array.

As described above, in touch panel applications, accuracy is defined as error between the location of a conductive object on or in proximity to the touch panel and the location sensed by the touch panel. The sensed, or calculated location is based on the overall signal magnitude and profile of the presence of the conductive object detected by the capacitive sense circuitry. For example, a single finger touch generates signals across a neighborhood of sense elements, which create a signal profile. Signal degradation or a deformed signal profile causes accuracy problems, including the variations in the accuracy at the dead zone areas. As described above, the dead zone area is often defined as an area between the pairs of the sense elements along the vertical axis that receives a weak split signal partly from a sense element of one pair and partly from a sense element of the other pair. However, this signal generated partly from each pair provides a split signal which is inconsistent and not sufficient for centroid determination of the conductive object. The embodiments described herein remove the dead zone area in order to improve the accuracy.

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

Figure 1:
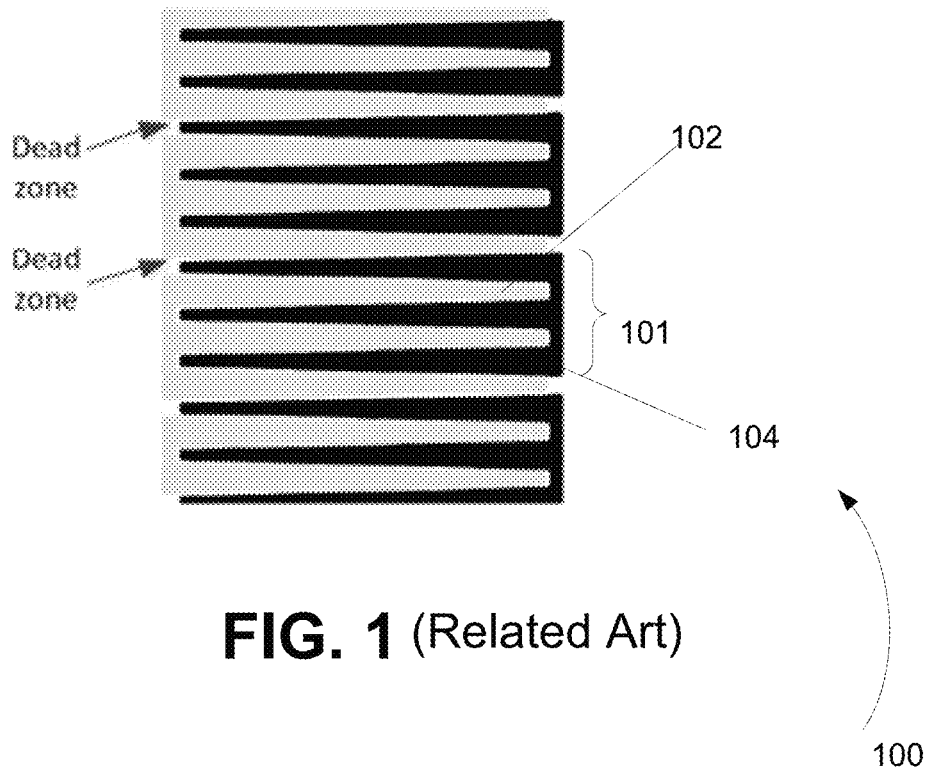
FIG. 1 illustrates a conventional design of a capacitance sense array with aligned set of pairs of sense elements.
Figure 2:
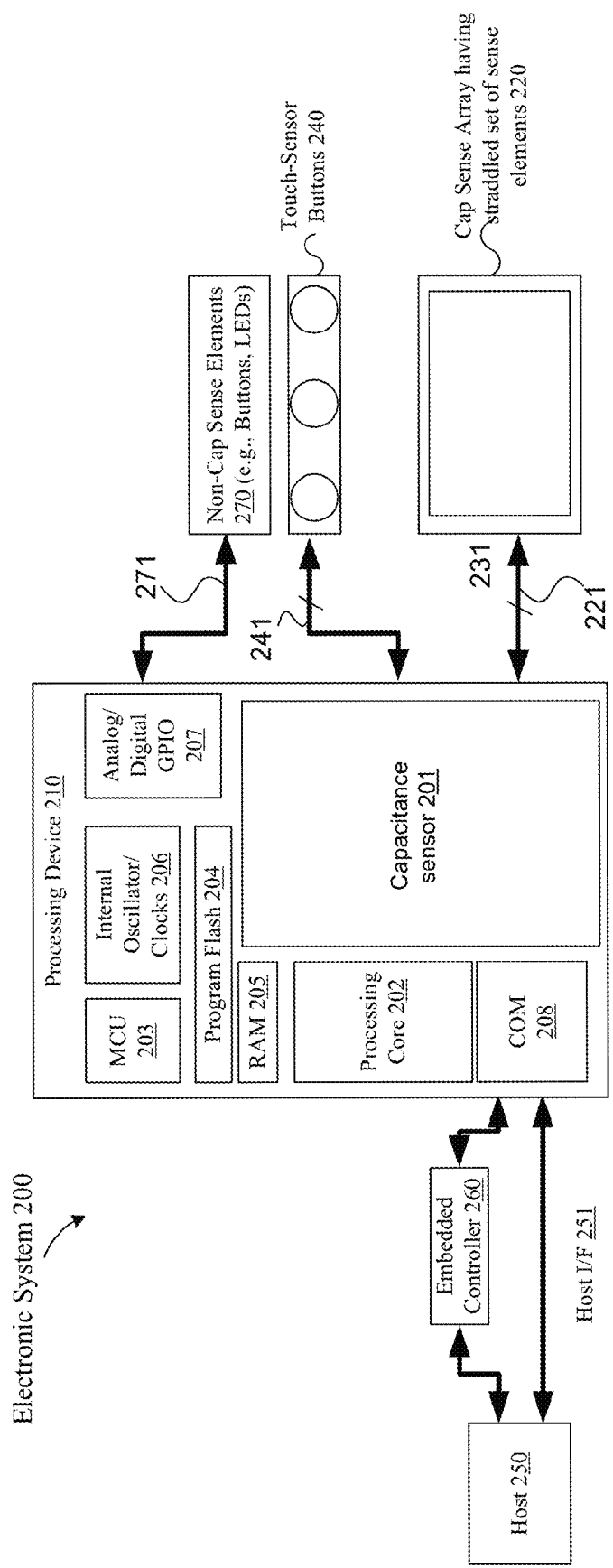
FIG. 2 illustrates a block diagram illustrating one embodiment of an electronic system having a processing device for detecting a presence of a conductive object on a capacitive sense array having straddled sense elements according to embodiments of the present invention.

FIG. 2 is a block diagram illustrating one embodiment of an electronic system 200 having a processing device for detecting a presence of a conductive object on a capacitive sense array having straddled set of sense elements 220 according to embodiments of the present invention. Electronic system 200 includes processing device 210, capacitive sense array having straddle set of sense elements 220, touch-sense buttons 240, host processor 250, embedded controller 260, and non-capacitance sense elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not shown). The digital block array may be configured to implement a variety of digital logic circuits (e.g., DACs, digital filters, or digital control systems) using, in one embodiment, configurable user modules ("UMs"). The digital block array may be coupled to a system bus. Processing device 210 may also include memory, such as random access memory ("RAM") 205 and program flash 204. RAM 205 may be static RAM ("SRAM"), and program flash 204 may be a non-volatile storage, which may be used to store firmware (e.g., control algorithms executable by processing core 202 to implement operations described herein). Processing device 210 may also include a microcontroller unit ("MCU") 203 coupled to memory and the processing core 202.

The processing device 210 may also include an analog block array (not shown). The analog block array is also coupled to the system bus. Analog block array also may be configured to implement a variety of analog circuits (e.g., ADCs or analog filters) using, in one embodiment, configurable UMs. The analog block array may also be coupled to the GPIO ports 207.

As illustrated, capacitance sensor 201 may be integrated into processing device 210. Capacitance sensor 201 may include analog I/O for coupling to an external component, such as capacitive sense array having straddled set of sense elements 220, touch-sense buttons 240, and/or other devices. Capacitance sensor 201 and processing device 210 are described in more detail below.

The embodiments described herein can be used in any capacitive sense array application, for example, the capacitive sense array having straddled sense elements 220 may be a touch screen, a touch-sense slider, or touch-sense buttons 240 (e.g., capacitance sense buttons). In one embodiment, these sense devices may include one or more capacitive sense elements. The operations described herein may include, but are not limited to, notebook pointer operations, lighting control (dimmer), volume control, graphic equalizer control, speed control, or other control operations requiring gradual or discrete adjustments. It should also be noted that these embodiments of capacitive sense implementations may be used in conjunction with non-capacitive sense elements 270, including but not limited to pick buttons, sliders (ex. display brightness and contrast), scroll-wheels, multi-media control (ex. volume, track advance, etc) handwriting recognition and numeric keypad operation.

In one embodiment, the electronic system 200 includes a capacitive sense array having straddled set of sense elements 220 coupled to the processing device 210 via bus 221. The capacitive sense array having straddled set of sense elements 220 may include a one-dimensional sense array in one embodiment and a two dimensional sense array in another embodiment. Alternatively, the capacitive sense array having straddled set of sense elements 220 may have more dimensions. Also, in one embodiment, the capacitive sense array having straddled set of sense elements 220 may be sliders, touchpads, touch screens or other sensing devices. In another embodiment, the electronic system 200 includes touch-sense buttons 240 coupled to the processing device 210 via bus 241. Touch-sense buttons 240 may include a single-dimension or multi-dimension sense array. The single- or multi-dimension sense array may include multiple sense elements. For a touch-sense button, the sense elements may be coupled together to detect a presence of a conductive object over the entire surface of the sense device. Alternatively, the touch-sense buttons 240 may have a single sense element to detect the presence of the conductive object. In one embodiment, touch-sense buttons 240 may include a capacitive sense element. Capacitive sense elements may be used as non-contact sense elements. These sense elements, when protected by an insulating layer, offer resistance to severe environments.

The electronic system 200 may include any combination of one or more of the capacitive sense array having straddled set of sense elements 220, and/or touch-sense button 240. In another embodiment, the electronic system 200 may also include non-capacitance sense elements 270 coupled to the processing device 210 via bus 271. The non-capacitance sense elements 270 may include buttons, light emitting diodes ("LEDs"), and other user interface devices, such as a mouse, a keyboard, or other functional keys that do not require capacitance sensing. In one embodiment, bus 271, 241, 231, and 221 may be a single bus. Alternatively, these buses may be configured into any combination of one or more separate buses.

Processing device 210 may include internal oscillator/clocks 206 and communication block ("COM") 208. The oscillator/clocks block 206 provides clock signals to one or more of the components of processing device 210. Communication block 208 may be used to communicate with an external component, such as a host processor 250, via host interface ("I/F") line 251. Alternatively, processing device 210 may also be coupled to the embedded controller 260 to communicate with the external components, such as host processor 250. In one embodiment, the processing device 210 is configured to communicate with the embedded controller 260 or the host processor 250 to send and/or receive data.

Processing device 210 may reside on a common carrier substrate such as, for example, an integrated circuit ("IC") die substrate, a multi-chip module substrate, or the like. Alternatively, the components of processing device 210 may be one or more separate integrated circuits and/or discrete components. In one exemplary embodiment, processing device 210 may be the Programmable System on a Chip ("PSoC®") processing device, developed by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to a host, but may include a system that measures the capacitance on the sense device and sends the raw data to a host computer where it is analyzed by an application. In effect the processing that is done by processing device 210 may also be done in the host.

It is noted that the processing device 210 of FIG. 2 may measure capacitance using various techniques, such as self-capacitance sensing and mutual capacitance sensing. The self-capacitance sensing mode is also called single-electrode sensing mode, as each sensor element needs only one connection wire to the sensing circuit. For the self-capacitance sensing mode, touching the sensor element increases the sensor capacitance as added by the finger touch capacitance is added to the sensor capacitance. The mutual capacitance change is detected in the mutual capacitance-sensing mode. Each sensor element uses at least two electrodes: one is a transmitter (TX) electrode (also referred to herein as transmitter electrode) and the other is a receiver (RX) electrode. When a finger touches a sensor element or is in close proximity to the sensor element, the capacitive coupling between the receiver and the transmitter of the sensor element is decreased as the finger shunts part of the electric field to ground (e.g., chassis or earth).

Capacitance sensor 201 may be integrated into the IC of the processing device 210, or alternatively, in a separate IC. The capacitance sensor 201 may include relaxation oscillator (RO) circuitry, a sigma delta modulator (also referred to as CSD) circuitry, charge transfer circuitry, charge accumulation circuitry, or the like, for measuring capacitance as would be appreciated by one of ordinary skill in the art having the benefit of this disclosure. Alternatively, descriptions of capacitance sensor 201 may be generated and compiled for incorporation into other integrated circuits. For example, behavioral level code describing capacitance sensor 201, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above.

In one embodiment, electronic system 200 is used in a notebook computer. Alternatively, the electronic device may be used in other applications, such as a mobile handset, a personal data assistant ("PDA"), a keyboard, a television, a remote control, a monitor, a handheld multi-media device, a handheld video player, a handheld gaming device, or a control panel.

Figure 3:
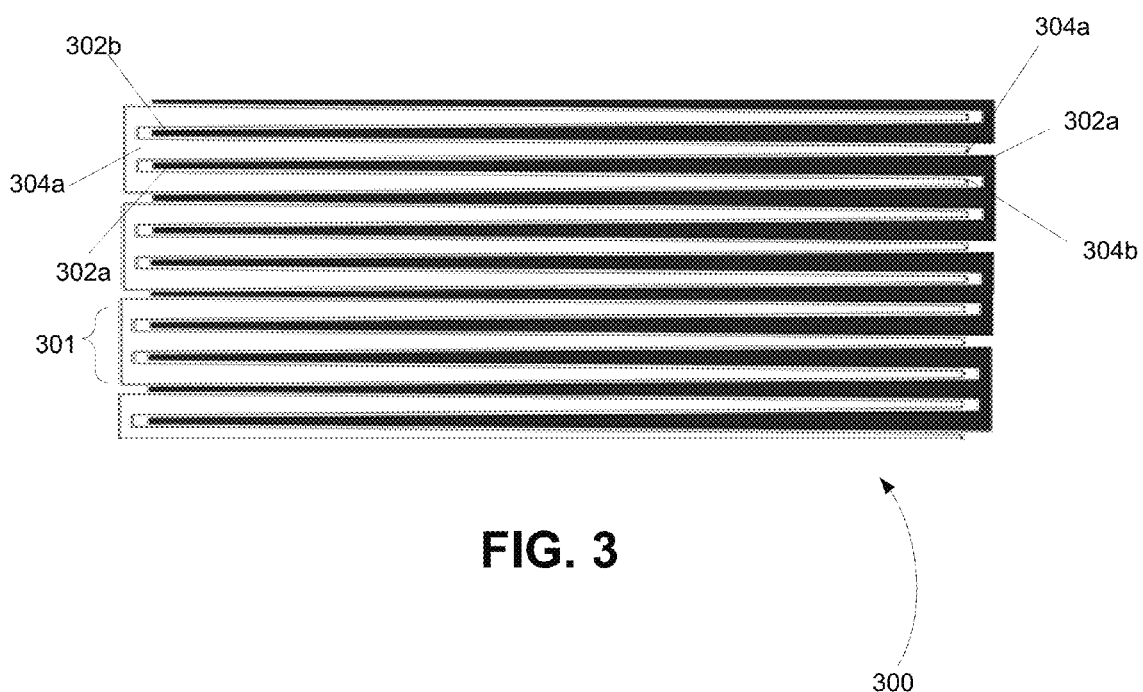
FIG. 3 illustrates a plan view of one embodiment of a capacitive sense array having straddled sense elements.

FIG. 3 illustrates an exemplary plan view of one embodiment of a capacitive sense array 300 on a single ITO layer of multiple rows 301 of tapered shaped sense elements. The capacitive sense array 300 having a first set of sense elements 302 and second set of sense elements 304 disposed in a first longitudinal axis of the capacitive sense array 300 to detect a conductive object proximate to the capacitive sense array 300 in multiple dimensions. Even though in the embodiment disclosed in FIG. 3, the first and the second set of the sense elements 302 and 304 respectively are illustrated as disposed in a horizontal axis, it is noted that the first set of sense elements 302 and the second set of the sense elements 304 may be disposed vertically as would be appreciated by one of ordinary skill in the art having the benefit of this disclosure. As illustrated in FIG. 3, each of sub-sections of sense elements from the first set of sense elements 302 straddle the sub-sections of at least two adjacent sense elements of the second set of sense elements 304. Similarly, each of sub-sections of sense elements of the second set of sense elements 304 straddle at least the sub-sections of at least two adjacent sense elements of the first set of sense elements 302. As described above, straddle in the present invention is defined as shifting and interleaving sub-section of one sense element with the sub-sections of at least two sense elements adjacent to the one sense element. In the embodiment shown in FIG. 3, the sub-sections of sense elements in FIG. 3 are elongated, although in other embodiments, the sub-sections may include other shapes such as rectangles, squares, diamonds as would be appreciated by one of ordinary skill in the art having the benefit of this disclosure.

As an example shown in FIG. 3, each of the first set of sense elements 302 include at least prongs 302a and 302b each of which having elongated sections and each of the second set of sense elements 304 include at least prongs 304a and 304b each of which having elongate sections. Specifically, as an example, the elongated section of the prong 302a from the first set of sense elements 302 straddles the elongated sections of the two prongs 304a and 304b from the second set of sense elements 304, which are adjacent to the prong 302a. Similarly, as an example, the elongated section of the prong 304a from the second set of sense elements 304 straddles the elongated sections of the two prongs 302a and 302b from the first set of sense elements 302 which are adjacent to the prong 304a.

As illustrated in FIG. 3, instead of perfectly aligning the first set of sense elements 302 and the second set of sense elements 304, each of the elongated sections of the prongs 302a and 304a of the first and second set of sense elements 302 and 304 respectively are intentionally shifted and interleaved in the first longitudinal axis with respect to each other. This intentional shift and interleave on the same axis creates a positional offset in the first longitudinal axis between each of the prongs in the first set of sense elements 302 and the adjacent prongs in the second set of sense elements 304. This intentional shift and interleave of prongs removes the discontinuity and gap between the rows 301, thus eliminating the existence of dead zone area along the vertical axis as shown in FIG. 3. So, for every location on the capacitive sense array 300, the signal generated by the placement of the conductive object, such as a finger will be received by a center of either one of a top prong or a bottom prong. The top prong may be one of the first set of sense elements 302 or the second set of sense elements 304. Similarly, the bottom prong may be one of the first set of sense elements 302 or the second set of sense elements 304. This removal of the dead zone area provides for a more accurate and sufficient information to determine centroid of a conductive object such as a finger, thus resulting in an accurate position of the finger on the first longitudinal axis.

Figure 4:
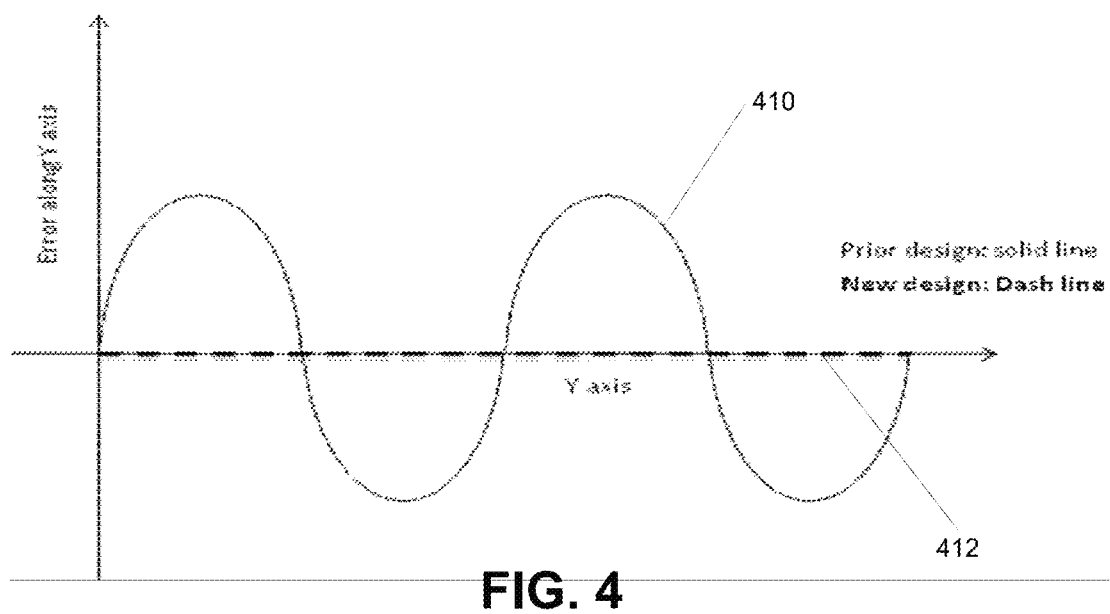
FIG. 4 illustrates a graphical representation of comparison of periodic accuracy error of a signal generated from the conventional design and the design of capacitive sense array embodiments of the present invention.

FIG. 4 illustrates a graphical representation of comparison of periodic accuracy of a periodic error 410 generated from the conventional design and the signal 412 generated by the capacitive sense array embodiments of the present invention. As noted in FIG. 4, the periodic dead zone along a vertical axis is removed in the embodiments of the capacitive sense array of the present invention, thus providing an error free constant signal.

Figure 5:
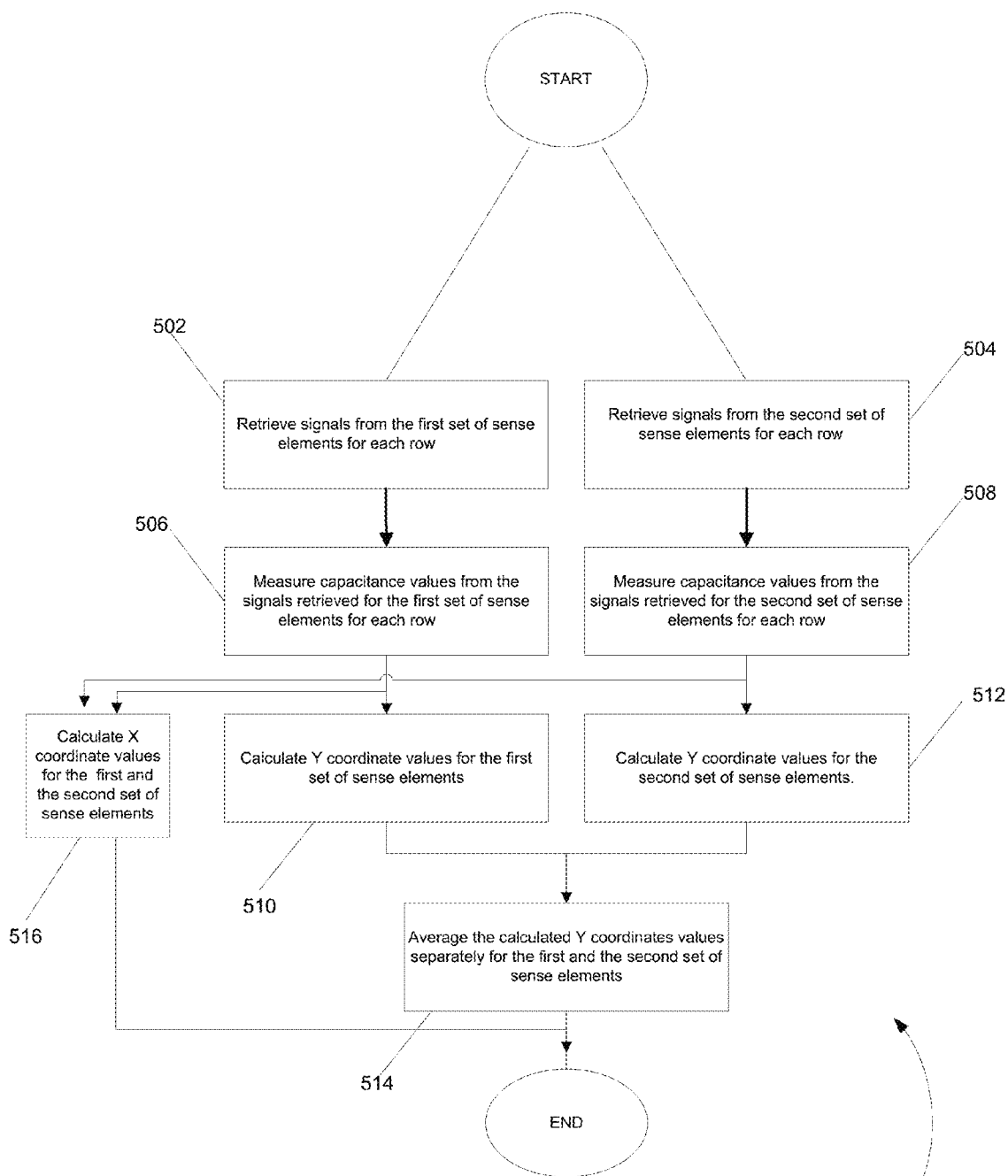
FIG. 5 illustrates a flow diagram of one embodiment of a method of processing the signals.

FIG. 5 is a flow diagram of one embodiment of a method for processing signals generated by placement of a conductive object on or proximate to the capacitive sense array 300 of the present invention. In the present invention, processing device 210 functions to perform the method 500. It is noted that other hardware, software or combination of these components may be used to perform method 500. The method 500 starts from block 502 at which signals generated from a touch location of the conductive object on or proximate the first set of sense elements 302 in each row 301 are retrieved by the capacitance sensor 201. Similarly, at block 504, signals generated from the touch location of the conductive object on or proximate the second set of sense elements 304 in each row 301 are retrieved by the capacitance sensor 201. At block 506, the processing core 202 measures capacitance values from the signals received for the first set of sense signals for each row 301. At block 508, the processing core 202 measures capacitance values from the signals received for the second set of sense signals for each row 301. At block 510, the processing core 202 calculates Y coordinate values for the first set of sense elements 302 using a center of mass calculation using the peak row and its two nearest neighbors. The algorithm for center of mass calculation functions such that at least three adjacent signals, for example, S1, S2 and S3 and its corresponding location coordinates, Y1, Y2 and Y3 respectively are detected at each row 301 for the first set of sense elements 302. Then the centroid value is calculated from the three signal distribution using the formula Yc= (Y1*S1+Y2*S2+Y3*S3)/(S1+S2+S2). At block 512, the processing core 202 calculates Y coordinate values for the second set of sense elements 304 using the center of mass calculation as described above. At block 514, the processing core 202 computes an average value for the Y coordinates values for the first set of sense elements 302 and the second set of sense elements 304. This average value provides the accurate y position of the conductive object on the touch panel device. At block 516, the processing core 202 calculates the X coordinate values using signals retrieved from both the first set and the second set of sense elements 302 and 304 respectively. In one embodiment, the X coordinate value is calculated as a ratio of the signal from the first set of elements 302 to the signal of the second set of elements 304. The formula used is: Xc=Xmax*Sr/(S1+Sr) where Sr is the set of signals from the sense elements on the right side of the capacitance sense array 300 while S1 is the set of signals from the sense elements on the left side of the capacitance sense array 300 and Xmax is the maximum X coordinate value reported by the sense element. The Xc coordinate value and the average Y coordinate value provides the accurate position of the conductive object on the touch panel device.

Figure 6:
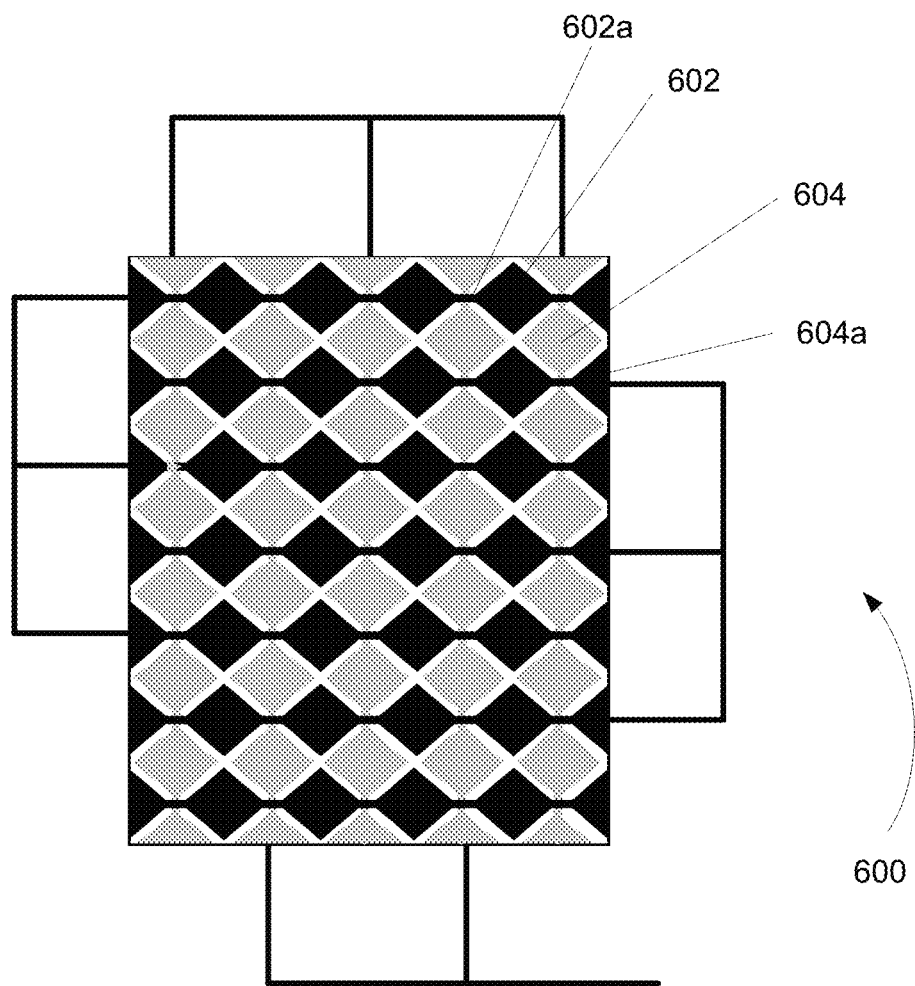
FIG. 6 illustrates a plan view of one embodiment of a capacitive sense array having straddled sense elements.

FIG. 6 illustrates an exemplary plan view of one embodiment of a capacitive sense array 600 on a dual ITO layer of diamond shaped sense elements. The capacitive sense array 600 includes a first set of sense elements 602 disposed in a first longitudinal axis of the capacitive sense array 600 and a second set of sense elements 604 disposed in a second longitudinal axis of the capacitive sense array 600 to detect a conductive object proximate to the capacitive sense array 600 in two dimensions. As shown in FIG. 6, each of the first set of sense elements 602 straddle the first set of sense elements 602 that is adjacent each of the first set of sense elements 602 in the horizontal axis. Also, each of the second set of sense elements 604 straddle the sense elements 604 that is adjacent each of the second set of sense elements 604 in the vertical axis. Specifically, as an example illustrated in FIG. 6, each of the first set of sense elements 602 include sub-sections 602a which straddle the sub-sections 602a of prongs 602a in horizontal axis. Similarly, each of the second set of sense elements 604 include sub-sections 604a which straddle the sub-sections of prongs 604a in vertical axis. As described above, straddle in the present invention is defined as shifting and interleaving sub-section of one sense element with the sub-sections of at least two sense elements adjacent to the one sense element.

Figure 7:
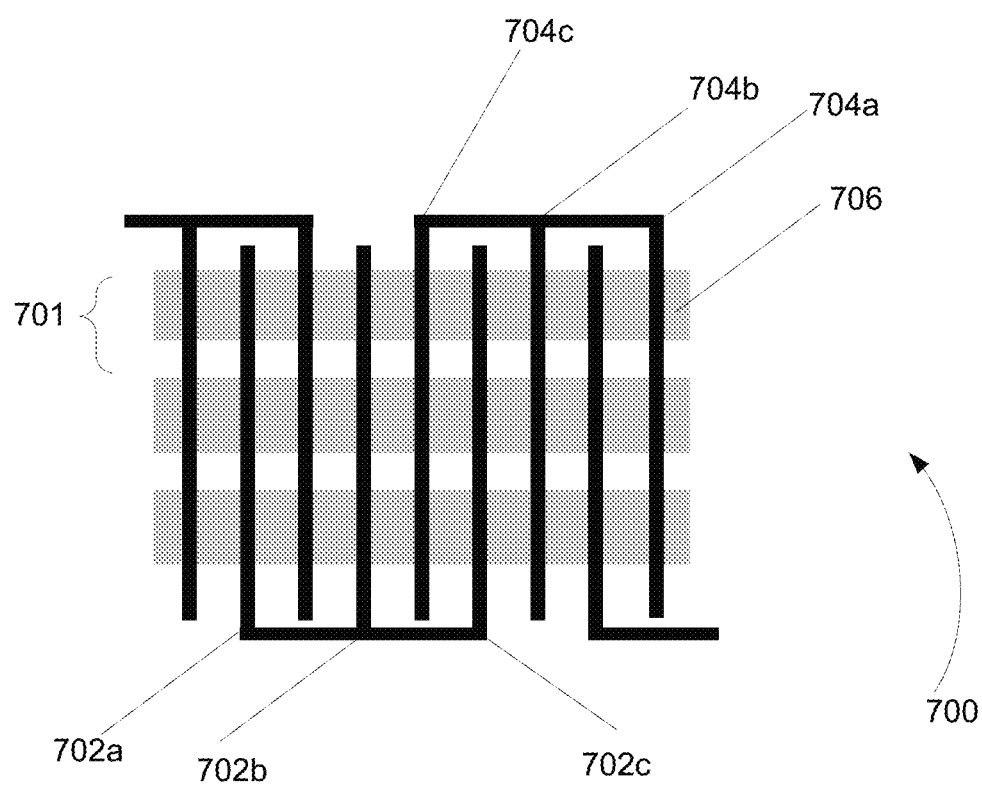
FIG. 7 illustrates a plan view of one embodiment of a capacitive sense array having straddled sense elements.

FIG. 7 illustrates an exemplary plan view of one embodiment of a capacitive sense array 700 on a dual ITO layer of stripe shaped sense elements having a plurality of rows 701 to detect a conductive object proximate to the capacitive sense array 700 in two dimensions. The capacitive sense array 700 includes a first set of sense elements 702 and a second set of sense elements 704 both of which are disposed in a first longitudinal axis of the capacitive sense array 700 in each row 701 of a first layer in a first dimension. The capacitive sense array 700 also includes a third set of sense elements 706 which are disposed in a second longitudinal axis of the capacitive sense array 700 in each row 701 of a second layer in a second dimension. The second longitudinal axis is substantially perpendicular to the first longitudinal axis. In this embodiment, the third set of sense elements 706 does not straddle. As shown in FIG. 7, each sense element of the first set of sense elements 702 straddle at least two adjacent sense elements in the second set of sense elements 704. Similarly, each sense element of the second set of sense elements 704 straddle at least two adjacent sense elements in the first set of sense elements 702.

As an example illustrated in FIG. 7, the first set of sense elements 702 include at least three prongs 702a, 702b and 702c each of which having sub-sections. Also, the second set of sense elements 704 includes at least three prongs 704a, 704b and 704c each of which having sub-sections. As an example, sub-sections of the prong 702c from the first set of sense elements 702 straddle the sub-sections of the prongs 704b and 704c from the second set of sense elements 704 which are adjacent to the prong 702c as illustrated in FIG. 7. Similarly, an example as shown in FIG. 7, sub-sections of the prong 704c from the second set of sense elements 704 straddle the sub-sections from the prongs 702b and 702c of the first set of sense elements 702 which are adjacent to the prong 704c. As described above, straddle in the present invention is defined as shifting and interleaving sub-section of one sense element with the sub-sections of at least two sense elements adjacent to the one sense element.

Although not shown, it is known to one skilled in the art, pattern as described and illustrated in FIG. 7 for the first dimension with the first set of sense elements 702 and the second set of sense elements 704 on the first layer may also be provided for the second dimension having the third set of sense elements 706 and a fourth set of sense elements (not shown) on the second layer.

Figure 8:
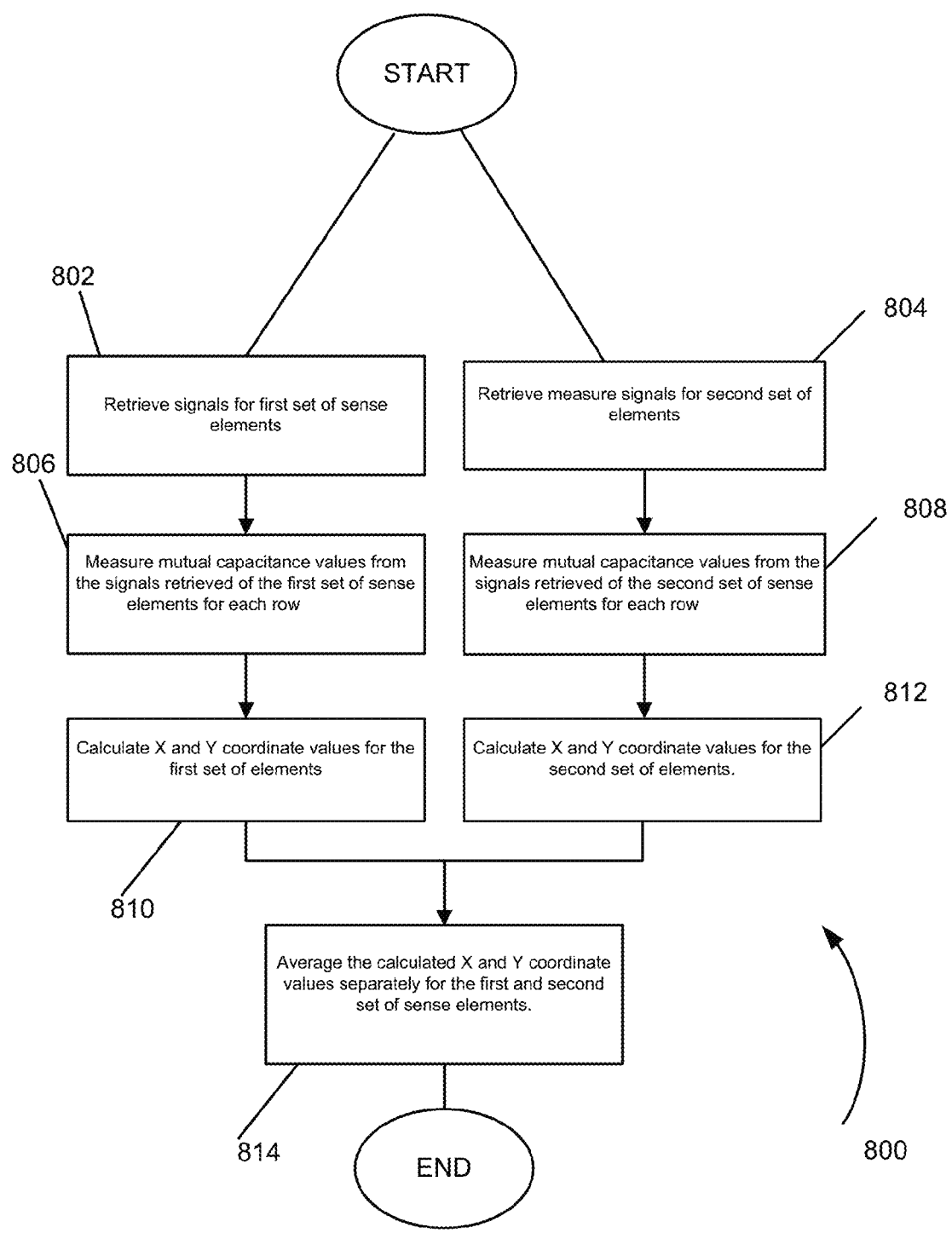
FIG. 8 illustrates a flow diagram of one embodiment of a method of processing the signals.

FIG. 8 is a flow diagram of one embodiment of a method for processing signals generated by placement of a conductive object on or proximate to the capacitive sense array 700 of the present invention. In the present invention, processing device 210 functions to perform the method 800. It is noted that other hardware, software or combination of these components may be used to perform method 800. The method 800 starts from block 802 at which the signals generated from a touch location of the conductive object on or proximate the first set of sense elements 702 in each row 701 are retrieved by the capacitance sensor 201. Similarly, at block 804, signals generated from the touch location of the conductive object on or proximate the second set of sense elements 704 in each row 701 are retrieved by the capacitance sensor 201. At block 806, the processing core 202 measures mutual capacitance values from the signals received for the first set of sense signals for each row 701. In one embodiment, the signals retrieved and measured include drive Tx signals and record Rx signals for the first set of sense elements 702. So, a mutual capacitance between each row 701 and the first set of sense elements 702 is measured. Similarly, at block 808, the processing core 202 measures mutual capacitance values from the signals received for the second set of sense signals for each row 701. So, a mutual capacitance between each row 701 and the second set of sense elements 704 is measured. At block 810, the processing core 202 calculates X and Y coordinate values for the measured signals (i.e. Rx values in this example) of the first set of sense elements 702 using a center of mass calculation using the peak row and its two nearest neighbors using the center of mass algorithm described above. Similarly, at block 812, the processing core 202 calculates X and Y coordinate values for the measured signals (i.e. Rx values in this example) of the second set of sense elements 704 using a center of mass calculation using the peak row and its two nearest neighbors. At block 814, the processing core 202 computes an average value for the X coordinate values separately for the first and second set of sense elements 702 and 704 respectively and also computes average value for the Y coordinate values separately for the first and the second set of sense elements 702 and 704 respectively. The average X and Y coordinate values provide the accurate position of the conductive object on the touch panel device.

It is noted that in the above embodiments, the Figures include tapered, stripes and diamonds but other shapes may be used such as, squares, hexagons, pentagons, as well as other tessellated shapes as would be appreciated by one of ordinary skill in the art having the benefit of this disclosure.

FIGS. 9A-9C illustrate embodiments of assembled layer structures of the capacitive sense array 900. FIG. 9A shows the assembled layer structure for a polyethylene terephthalate (PET) technology having a single layer of ITO. It is noted that the sensor elements are not limited to ITO and may be formed of other optically transmissive conductive materials. As shown in FIG. 9A, an optical clear adhesive (OCA) having a thickness in the range of 0.05 mm to 0.2 mm lays only on the ITO. An overlay, such as a polymer or glass having a thickness in the range of 0.55 mm to 1.1 mm resides on top of the OCA. A film having a thickness in the range of 0.1 mm to 0.18 mm is placed below the ITO. FIG. 9B illustrates a glass technology in which the film of FIG. 9A is replaced with a sensor glass having a thickness in the range of 0.1 mm to 0.18 mm. FIG. 9C illustrates a sensor on cover technology in which an ITO layer is placed directly onto the bottom of the glass overlay. Alternatively, other dimensions of the thickness may be used as would be appreciated by one of ordinary skill in the art having the benefit of this disclosure.

It is noted that in the above embodiments, the orientation of the axes may be switched to other configurations known to one skilled in the art. It is also noted that the sense elements as disclosed in the above embodiments comprise of tapered, stripes and diamonds, however, one skilled in the art would appreciate that the sense elements may comprise other shapes such as rectangles, squares, circles, triangles or other shapes and configurations as would be appreciated by one of ordinary skill in the art having the benefit of this disclosure.

The particular features, structures or characteristics described herein may be combined as suitable in one or more embodiments of the invention. In addition, while the invention has been described in terms of several embodiments, those skilled in the art will recognize that the invention is not limited to the embodiments described. The embodiments of the invention can be practiced with modification and alteration within the scope of the appended claims. The specification and the drawings are thus to be regarded as illustrative instead of limiting on the invention.

What is claimed is:

1. A sense array comprising:
a first set of sense elements comprising 1st, 2nd, and 3rd sense elements disposed substantially parallel to each other, wherein the first set of sense elements is electrically connected together at a first end of the sense array;
a second set of sense elements comprising 4th, 5th, and 6th sense elements disposed substantially parallel to each other, wherein the second set of sense elements is electrically connected together at a second end of the sense array opposite the first end; and
a third set of sense elements comprising 7th, 8th, and 9th sense elements disposed substantially parallel to each other, wherein the 1st sense element extends between the 5th and 6th sense elements, the 2nd sense element extends between the 6th and 7th sense elements, the 3rd sense element extends between the 7th and 8th sense elements, and the third set of sense elements is electrically connected together at the second end of the sense array.

2. The sense array of claim 1, further comprising a fourth set of sense elements comprising $10^{th}$, $11^{th}$, and $12^{th}$ elements disposed substantially perpendicular to each sense element of the first set of sense elements.

3. The sense array of claim 1, wherein each of the sense elements of the first set of sense elements is disposed substantially parallel to each of the sense elements of the second set of sense elements.

4. The sense array of claim 1, wherein each of the $1^{st}$, $2^{nd}$ and $3^{rd}$ sense elements is substantially linear in shape.

5. The sense array of claim 1, wherein each of the $1^{st}$, $2^{nd}$ and $3^{rd}$ sense elements is triangular in shape.

6. The sense array of claim 1, wherein each of the $1^{st}$, $2^{nd}$ and $3^{rd}$ sense elements comprises a respective chain of connected polygons.

7. The sense array of claim 1, wherein each of the first, second, and third sets of sense elements is formed from an optically transmissive conductive material.

8. The sense array of claim 1, wherein each of the first, second, and third sets of sense elements is disposed on an optically transmissive substrate.

9. The sense array of claim 1, wherein each of the first, second, and third sets of sense elements is configured to be coupled to a capacitance sensor configured to sense the location of a conductive object proximate to the sense array.

10. A processing device comprising:
a host interface; and
a capacitance sensor coupled to the host interface, the capacitance sensor configured to be coupled to a sense array comprising:
a first set of sense elements comprising $1^{st}$, $2^{nd}$, and $3^{rd}$ sense elements disposed substantially parallel to each other, wherein the first set of sense elements is electrically connected together at a first end of the sense array;
a second set of sense elements comprising $4^{th}$, $5^{th}$, and $6^{th}$ sense elements disposed substantially parallel to each other, wherein the second set of sense elements is electrically connected together at a second end of the sense array opposite the first end; and
a third set of sense elements comprising $7^{th}$, $8^{th}$, and $9^{th}$ sense elements disposed substantially parallel to each other, wherein the $1^{st}$ sense element extends between the $5^{th}$ and $6^{th}$ sense elements, the $2^{nd}$ sense element extends between the $6^{th}$ and $7^{th}$ sense elements, the $3^{rd}$ sense element extends between the $7^{th}$ and $8^{th}$ sense elements, and the third set of sense elements is electrically connected together at the second end of the sense array.

11. The processing device of claim 10, further comprising a fourth set of sense elements comprising $10^{th}$, $11^{th}$ and $12^{th}$ elements disposed substantially perpendicular to each sense elements of the first set of sense elements.

12. The processing device of claim 10, wherein each of the sense elements of the first set of sense elements is disposed substantially parallel to each of the sense elements of the second set of sense elements.

13. The processing device of claim 10, wherein each of the $1^{st}$, $2^{nd}$ and $3^{rd}$ sense elements is substantially linear in shape.

14. The processing device of claim 10, wherein each of the $1^{st}$, $2^{nd}$ and $3^{rd}$ sense elements is triangular in shape.

15. The processing device of claim 10, wherein each of the $1^{st}$, $2^{nd}$ and $3^{rd}$ sense elements comprises a respective chain of connected polygons.

16. A method comprising:
at an electronic device having a sense array comprising a first set of sense elements, a second set of sense elements, and a third set of sense elements, one or more processors, and memory storing one or more programs configured for execution by the one or more processors; wherein:
the first set of sense elements comprises 1st, 2nd, and 3rd sense elements disposed substantially parallel to each other, and the first set of sense elements is electrically connected together at a first end of the sense array;
the second set of sense elements comprises 4th, 5th, and 6th sense elements disposed substantially parallel to each other, and the second set of sense elements is electrically connected together at a second end of the sense array opposite the first end; and
the third set of sense elements comprises 7th, 8th, and 9th sense elements disposed substantially parallel to each other, the 1st sense element extends between the 5th and 6th sense elements, the 2nd sense element extends between the 6th and 7th sense elements, the 3rd sense element extends between the 7th and 8th sense elements, and the third set of sense elements is electrically connected together at the second end of the sense array;
measuring, by the one or more processors, a first set of mutual capacitance values for the first set of sense elements;
measuring, by the one or more processors, a second set of mutual capacitance values for the second set of sense elements; and
calculating a touch location based on the first and second sets of mutual capacitance values.

17. The method of claim 16, wherein calculating the touch location comprises computing a first set of coordinate values and a second set of coordinate values.

18. The method of claim 17, wherein calculating the touch location further comprises averaging the first set of coordinate values and the second set of coordinate values.

19. The method of claim 17, further comprising transmitting the touch location to a host using a host interface of the electronic device.

20. The method of claim 16, wherein the sense array comprises a fourth set of sense elements disposed substantially perpendicular to each sense element of the first set of sense elements.

* * * * *

UNITED STATES PATENT AND TRADEMARK OFFICE
CERTIFICATE OF CORRECTION

PATENT NO. : 9,785,294 B2
APPLICATION NO. : 14/557202
DATED : October 10, 2017
INVENTOR(S) : Peng et al.

It is certified that error appears in the above-identified patent and that said Letters Patent is hereby corrected as shown below:

In the Claims

Claim 11, Column 11, Line 38, please delete "elements of the first" and insert --element of the first--.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*